(12) United States Patent
Liou et al.

(10) Patent No.: US 9,570,339 B2
(45) Date of Patent: Feb. 14, 2017

(54) SEMICONDUCTOR STRUCTURE AND PROCESS THEREOF

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/687,932

(22) Filed: Apr. 16, 2015

(65) Prior Publication Data

US 2016/0284587 A1  Sep. 29, 2016

(30) Foreign Application Priority Data

Mar. 23, 2015  (CN) .......................... 2015 1 0127587

(51) Int. Cl.

| | |
|---|---|
| *H01L 21/70* | (2006.01) |
| *H01L 21/762* | (2006.01) |
| *H01L 21/033* | (2006.01) |
| *H01L 29/06* | (2006.01) |
| *H01L 29/34* | (2006.01) |
| *H01L 21/8234* | (2006.01) |

(52) U.S. Cl.
CPC ....... *H01L 21/76229* (2013.01); *H01L 21/033* (2013.01); *H01L 21/823431* (2013.01); *H01L 21/823481* (2013.01); *H01L 29/0649* (2013.01); *H01L 29/34* (2013.01)

(58) Field of Classification Search
CPC ............. H01L 21/3081; H01L 21/3085; H01L 21/3086; H01L 21/823431; H01L 29/0649; H01L 29/0692; H01L 29/785; H01L 21/76229; H01L 21/033; H01L 21/823481; H01L 29/34
USPC 257/510, 506, 365, 368, 392, 401; 438/437, 427
See application file for complete search history.

(56) References Cited

U.S. PATENT DOCUMENTS

| | | | |
|---|---|---|---|
| 8,216,947 B2 | 7/2012 | Lee | |
| 8,603,893 B1 | 12/2013 | Wei | |
| 8,610,240 B2 | 12/2013 | Lee | |
| 8,846,465 B2 | 9/2014 | Lee | |
| 9,263,340 B2* | 2/2016 | Taylor, Jr. ........ | H01L 21/823431 |
| 2013/0285146 A1* | 10/2013 | Tung .............. | H01L 21/823807 257/368 |
| 2014/0191358 A1* | 7/2014 | Liou ................ | H01L 21/76235 257/506 |
| 2014/0367795 A1* | 12/2014 | Cai .................... | H01L 27/0886 257/392 |

(Continued)

*Primary Examiner* — Mohammed Shamsuzzaman
(74) *Attorney, Agent, or Firm* — Winston Hsu; Scott Margo

(57) ABSTRACT

A semiconductor process including the following step is provided. A sacrificial layer is formed in a substrate. The sacrificial layer and the substrate are etched to form a trench in the sacrificial layer and the substrate. A first isolation material fills the trench, thereby a first isolation structure being formed. The sacrificial layer is patterned to form a plurality of sacrificial patterns. A plurality of spacers are formed beside the sacrificial patterns respectively. The sacrificial patterns are removed. Layouts of the spacers are transferred into the substrate, so that a plurality of fin structures are formed in the substrate. The spacers are then removed. The present invention also provides a semiconductor structure formed by said semiconductor process.

6 Claims, 9 Drawing Sheets

(56) References Cited

U.S. PATENT DOCUMENTS

| | | | |
|---|---|---|---|
| 2015/0035061 A1* | 2/2015 | Yoon | H01L 29/66545 257/365 |
| 2015/0249127 A1* | 9/2015 | Xie | H01L 29/0692 438/437 |
| 2015/0270159 A1* | 9/2015 | Huang | H01L 21/76229 438/427 |
| 2015/0318215 A1* | 11/2015 | Taylor, Jr. | H01L 21/823481 257/506 |
| 2016/0013184 A1* | 1/2016 | Alptekin | H01L 27/0886 257/401 |
| 2016/0071844 A1* | 3/2016 | Shen | H01L 27/0883 257/392 |

* cited by examiner

SEMICONDUCTOR STRUCTURE AND PROCESS THEREOF

BACKGROUND OF THE INVENTION

1. Field of the Invention

The present invention relates generally to a semiconductor structure and process thereof, and more specifically to a semiconductor structure integrating isolation structures and fin structures and process thereof.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and thus are more compatible. Moreover, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

On the other hand, due to integrated circuit devices evolving to be smaller and smaller and an increase of integration, distances and arrangements between devices within a semiconductor substrate are decreasing and becoming more tight. Therefore, suitable insulating or isolation has to be formed between each device to prevent each device from junction current leakage, and an insulating or isolation region is reduced to enhance integration in a perfect isolation. In various device isolation technologies, localized oxidation isolation (LOCOS) and shallow trench isolation (STI) are the most often used. In particular, STI has advantages of a smaller isolation region and retaining planarization of the semiconductor substrate. The prior art STI structure is formed between two metal oxide semiconductor (MOS) transistors and surrounds an active region in the semiconductor substrate to prevent carriers, such as electrons or electric holes, from drifting between two adjacent devices through the substrate to cause junction current leakage. STI not only isolates each device effectively but is also inexpensive, which suits semiconductor processes with high integration.

SUMMARY OF THE INVENTION

The present invention provides a semiconductor structure and process thereof, which integrates isolation structures and fin structures by applying sidewall image transfer (SIT) methods.

The present invention provides a semiconductor process including the following steps. A sacrificial layer is formed on a substrate. The sacrificial layer and the substrate are etched to form a first trench in the sacrificial layer and the substrate. A first isolation material fills in the first trench, thereby a first isolation structure being formed. The sacrificial layer is patterned to form a plurality of sacrificial patterns. A plurality of spacers are formed beside the sacrificial patterns respectively. The sacrificial patterns are removed. Layouts of the spacers are transferred to the substrate to form a plurality of fin structures in the substrate. The spacers are removed.

The present invention provides a semiconductor structure including a substrate and an isolation structure. The substrate has a plurality of fin structures. The isolation structure is disposed in the substrate beside the fin structures, wherein top surfaces of the fin structures are lower than a top surface of the isolation structure, the isolation structure includes a first isolation structure and a second isolation structure from bottom to top, and an interface is between the first isolation structure and the second isolation structure.

According to the above, the present invention provides a semiconductor structure and process thereof, which forms a sacrificial layer on a substrate; forms a first trench in the sacrificial layer and substrate; fills a first isolation material in the first trench, thereby a first isolation structure being formed; patterns the sacrificial layer to form a plurality of sacrificial patterns; forms a plurality of spacers beside the sacrificial patterns respectively; removes the sacrificial patterns; transfers layouts of the spacers into the substrate to form a plurality of fin structures in the substrate; and then, removes the spacers. Therefore, the isolation structure and the fin structures can be integrated.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
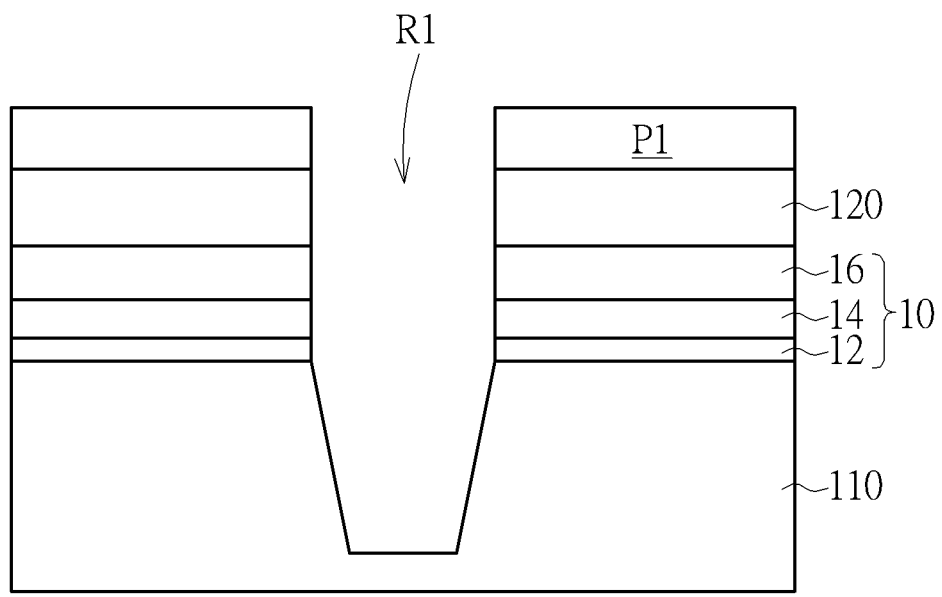
FIGS. 1-14 schematically depict cross-sectional views of a semiconductor process according to an embodiment of the present invention.

FIGS. 1-14 schematically depict cross-sectional views of a semiconductor process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A hard mask layer 10 may be optionally formed on the substrate 110. A sacrificial layer 120 is formed on the hard mask layer 10. In this embodiment, the hard mask layer 10 includes a pad oxide layer 12, a pad nitride layer 14 and an oxide layer 16 from bottom to top, but it is not limited thereto. In another embodiment, the hard mask layer 10 may be a single layer or a multi-layer, which may be composed of silicon oxide, silicon nitride, silicon oxynitride or others. In this embodiment, the sacrificial layer 120 is an amorphous silicon layer, but it is not limited thereto.

The sacrificial layer 120, the hard mask layer 10 and the substrate 110 are etched to form a first trench R1 in the sacrificial layer 120, the hard mask layer 10 and the substrate 110. More precisely, a photoresist (not shown) may be deposited and then patterned to form a patterned photoresist P1; layouts of the patterned photoresist P1 are transferred to the sacrificial layer 120, the hard mask layer 10 and the substrate 110, to form a first trench R1; and then, the patterned photoresist P1 is removed.

Figure 2:
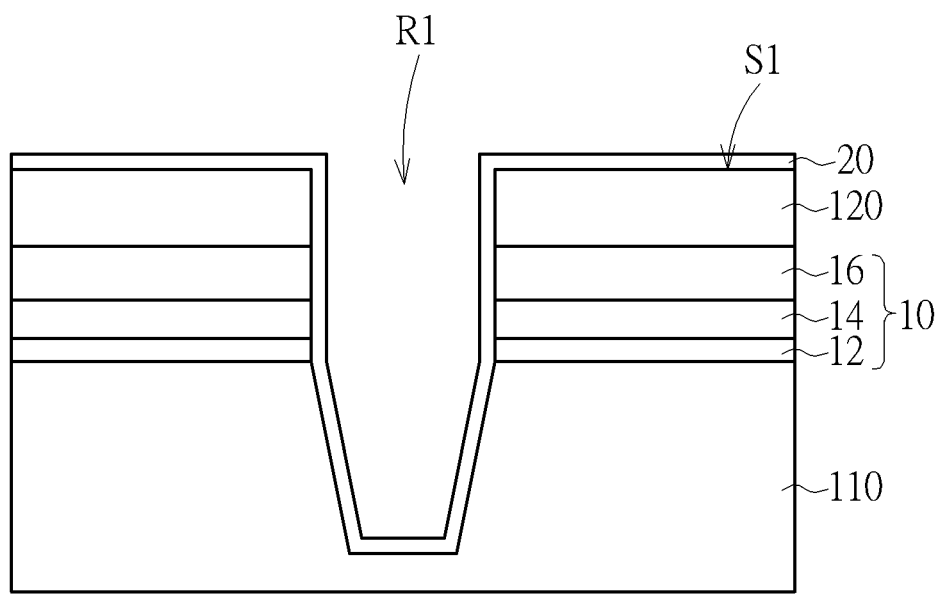

As shown in FIG. 2, a first liner 20 may optionally and conformally cover the first trench R1 and a top surface S1 of the sacrificial layer 120. The first liner 20 may be a single layer liner or a multi-layer liner, which may be composed of silicon oxide, silicon nitride, silicon oxynitride or others.

Figure 3:
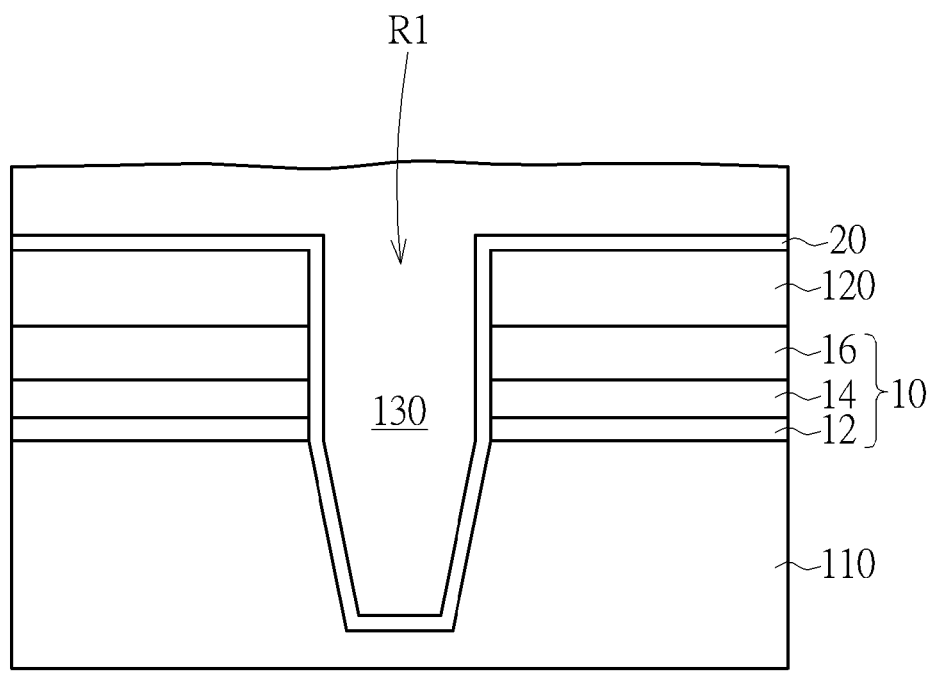
Figure 4:
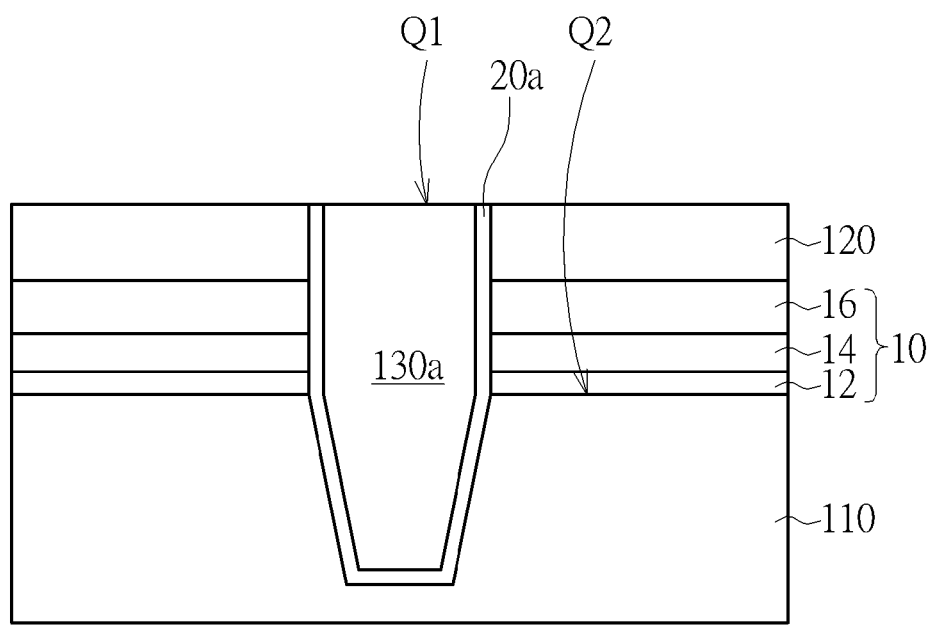

Please refer to FIGS. 3-4, a first isolation material 130 fills into the first trench R1, thereby a first isolation structure 130a being formed. More precisely, as shown in FIG. 3, the first isolation material 130 fills up the first trench R1 and covers the first liner 20. Then, the first isolation material 130 and the first liner 20 are planarized by processes such as a planarization process until the sacrificial layer 120 is exposed, thereby the first isolation structure 130a and a first liner 20a being formed, as shown in FIG. 4. The first isolation material 130 may be composed of oxides such as silicon oxide or others, but it is not limited thereto. It is noted that, due to the sacrificial layer 120 and the hard mask layer 10 being formed on the substrate 10 firstly, and the first isolation structure 130a being formed in the sacrificial layer 120, the hard mask layer 10 and the substrate 110 in the present invention, a top surface Q1 of the first isolation structure 130a is higher than a top surface Q2 of the substrate 110. Hence, top surfaces of later formed fin structures in the substrate 110 are inherently lower than the top surface of the first isolation structure.

Figure 5:
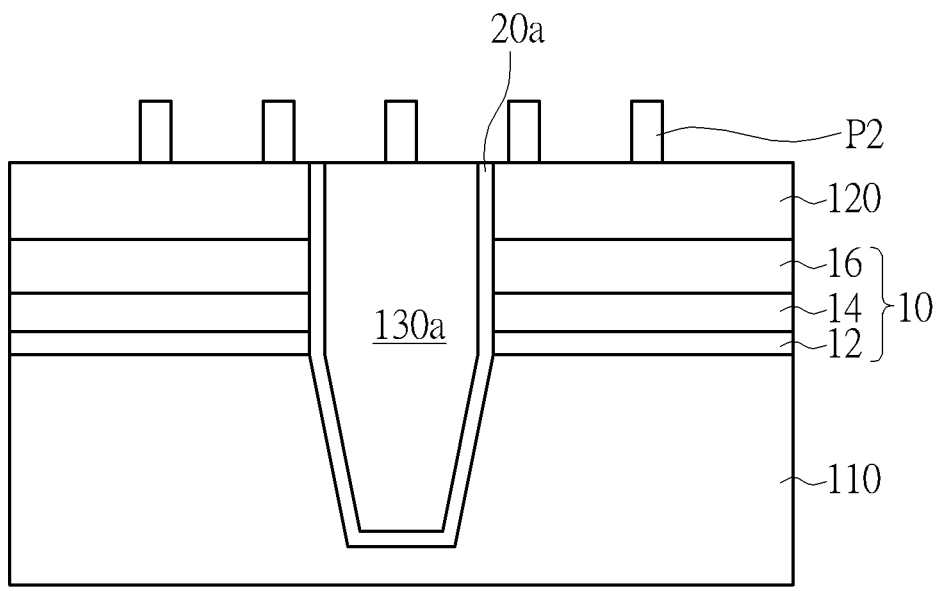
Figure 6:
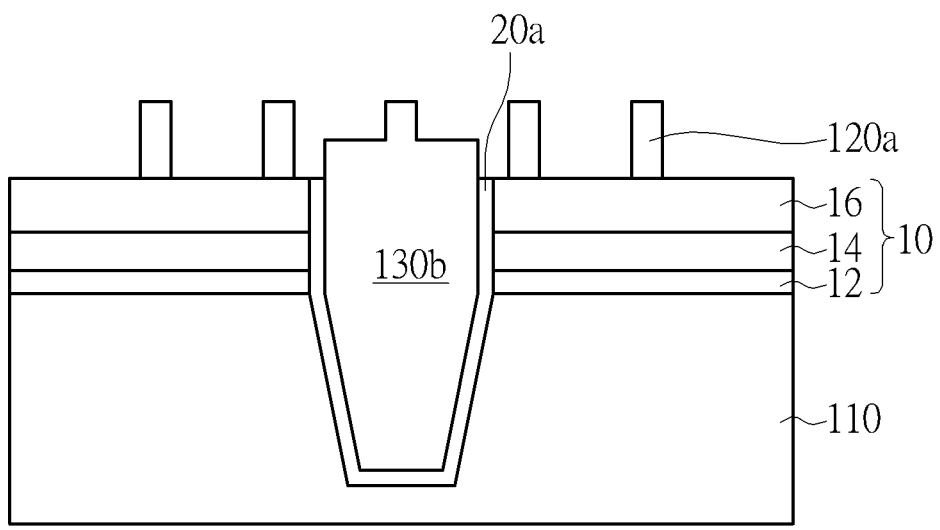

Please refer to FIGS. 5-6, the sacrificial layer 120 is patterned to form a plurality of sacrificial patterns 120a. More precisely, as shown in FIG. 5, a patterned photoresist P2 is formed on the sacrificial layer 120. As the patterned photoresist P2 is distributed uniformly, the patterned photoresist P2 will be located on the first isolation structure 130a as well. Then, layouts of the patterned photoresist P2 is transferred into the sacrificial layer 120 to form a plurality of sacrificial patterns 120a, as shown in FIG. 6. Thereafter, the patterned photoresist P2 is removed. In this embodiment, apart of the first isolation structure 130a is also etched while the layouts of the patterned photoresist P2 are transferred, thereby a first isolation structure 130b being formed, but it is not limited thereto. The profile of the first isolation structure 130b can be adjusted by the etching selectivity of an etching process to the first isolation structure 130a and the sacrificial layer 120.

Figure 7:
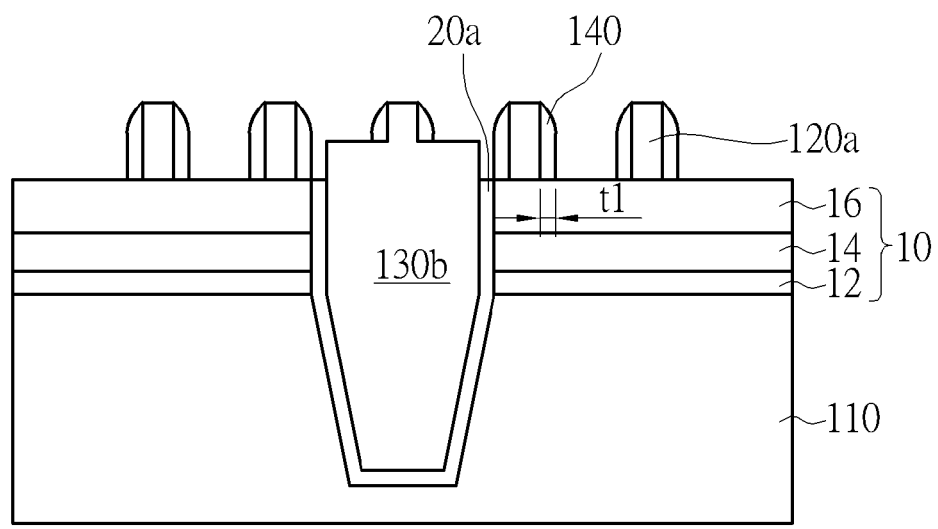
Figure 17:
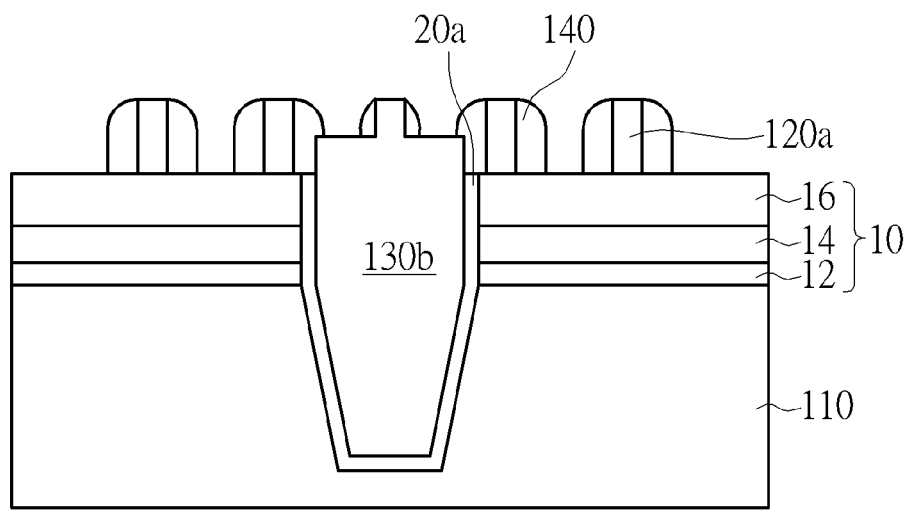
FIG. 17 schematically depicts a cross-sectional view of a semiconductor process according to still another embodiment of the present invention.

As shown in FIG. 7, a plurality of spacers 140 may be formed beside the sacrificial patterns 120a respectively. In this embodiment, the spacers 140 may be single layers, but the spacers 140 may be multi-layers, which may be constituted by silicon oxide, silicon nitride, silicon oxynitride or others, in other embodiments. Widths of later formed fin structures can be controlled by adjusting thicknesses t1 of the spacers 140. In this embodiment, the spacers 140 are formed only on the hard mask layer 10 and only on the first isolation structure 130b. In another embodiment, the spacers 140 may be disposed across the hard mask layer 10 and the first isolation structure 130b, as shown in FIG. 17. However, either as the spacers 140 only formed on the hard mask layer 10 and only on the first isolation structure 130b, or as the spacers disposed across the hard mask layer 10 and the first isolation structure 130b, later processes are common. Thereby, only an example applying the spacers 140 only on the hard mask layer 10 and only on the first isolation structure 130b is described in this embodiment.

Figure 8:
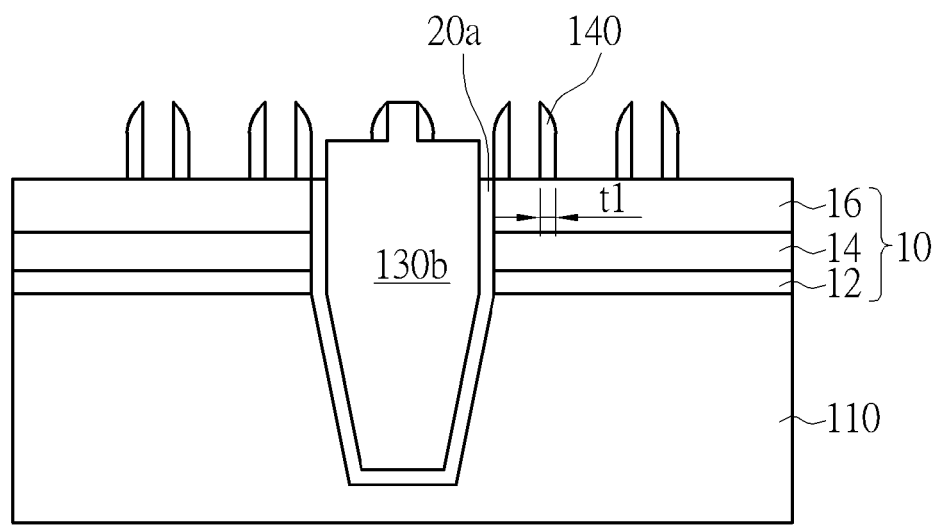

Thereafter, the sacrificial patterns 120a are removed, as shown in FIG. 8. Methods of removing the sacrificial patterns 120a may include a selective etching, which only removes the sacrificial patterns 120a. That is, due to the sacrificial patterns 120a, the spacers 140, the below hard mask layer 10 and the below first isolation structure 130b having different materials, the sacrificial patterns 120a can be etched individually by performing an etching process having etching selectivity to the sacrificial patterns 120a and other material layers, but it is not limited thereto.

Figure 9:
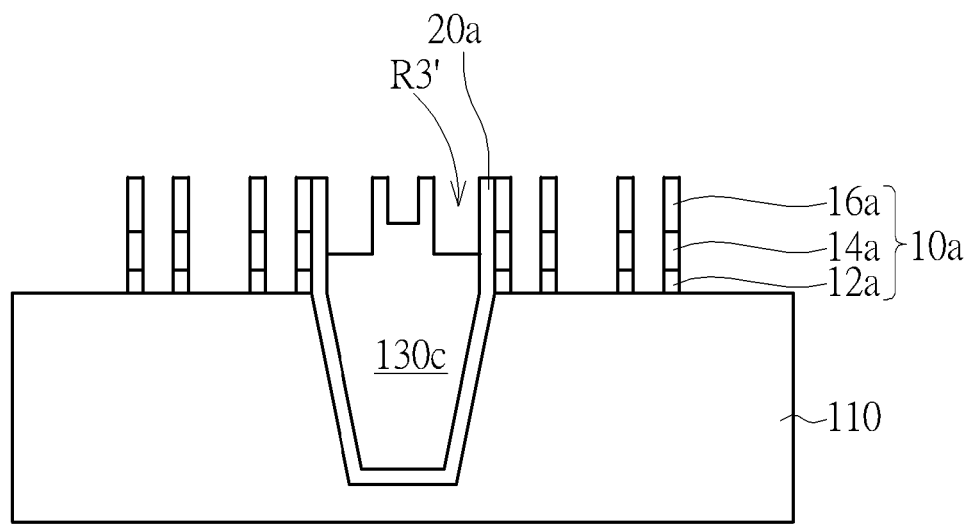
Figure 10:
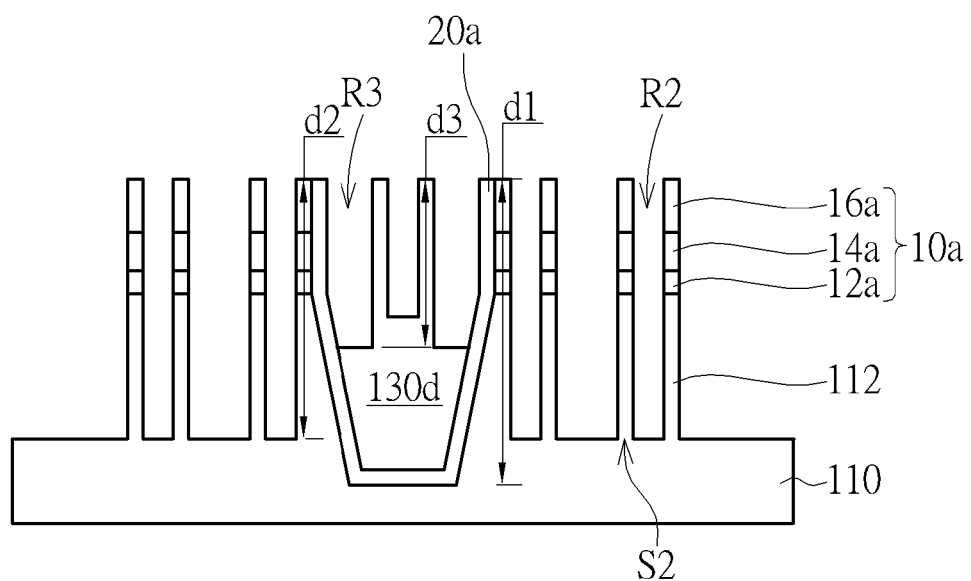

Please refer to FIGS. 9-10, layouts of the spacers 140 are transferred into the substrate 110 to form a plurality of fin structures 112 in the substrate 110. More precisely, layouts of the spacers 140 may be transferred into the hard mask layer 10 to form a plurality of hard masks 10a, and then the spacers 140 are removed, as shown in FIG. 9. In this embodiment, each of the hard masks 10a may include a pad oxide layer 12a, a pad nitride layer 14a and an oxide layer 16a from bottom to top, but it is not limited thereto. In other embodiments, the spacers 140 may be removed after a plurality of fin structures 112 are formed in the substrate 110. As the layouts of the spacers 140 are transferred into the hard mask layer 10, the first isolation structure 130b may be etched as well, thereby a first isolation structure 130c having a plurality of third trench R3' may be formed. Thereafter, layouts of the hard masks 10a may be transferred into the substrate 110 to form the plurality of fin structures 112 in the substrate 110, as shown in FIG. 10. As the layouts of the hard masks 10a are transferred into the substrate 110, the first isolation structure 130c may be etched as well, and the third trench R3' may be enlarged, thereby a first isolation structure 130d having a third trench R3 may be formed.

Moreover, a plurality of second trenches R2 are between the fin structures 112, wherein a depth d1 of the first isolation structure 130d is larger than bottom surfaces S2 of the fin structures 112. In other words, the depth d1 of the first isolation structure 130d is larger than depths d2 of the second trenches R2, but it is not limited thereto. The first isolation structure 130d has a plurality of the third trenches R3, and depths d3 of the third trenches R3 are all lower than the depths d2 of the second trenches R2, wherein three third trenches R3 are depicted in this embodiment, but the number of the trenches R3 are not restricted thereto.

Figure 11:
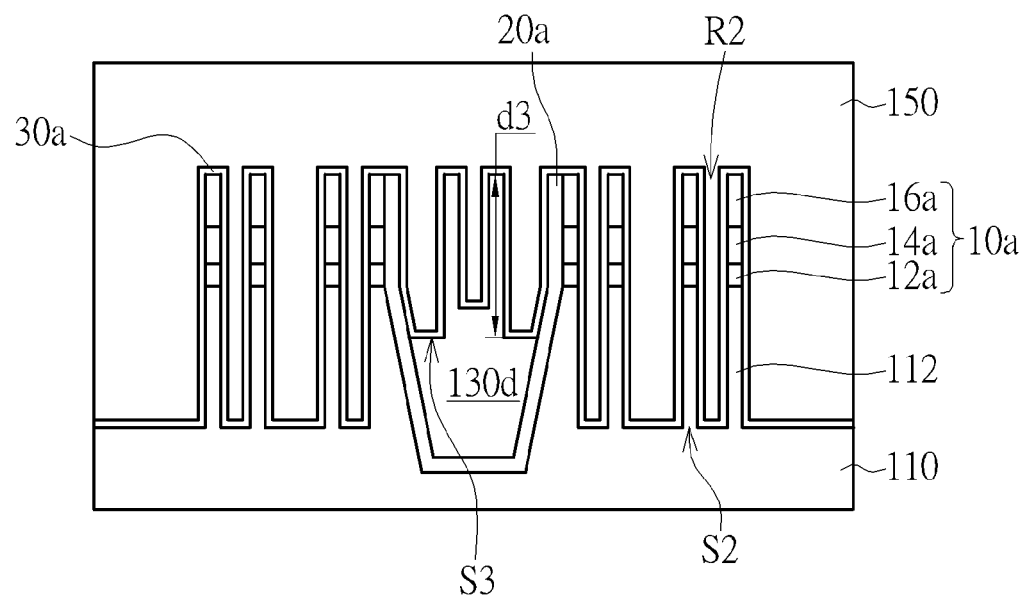
Figure 18:
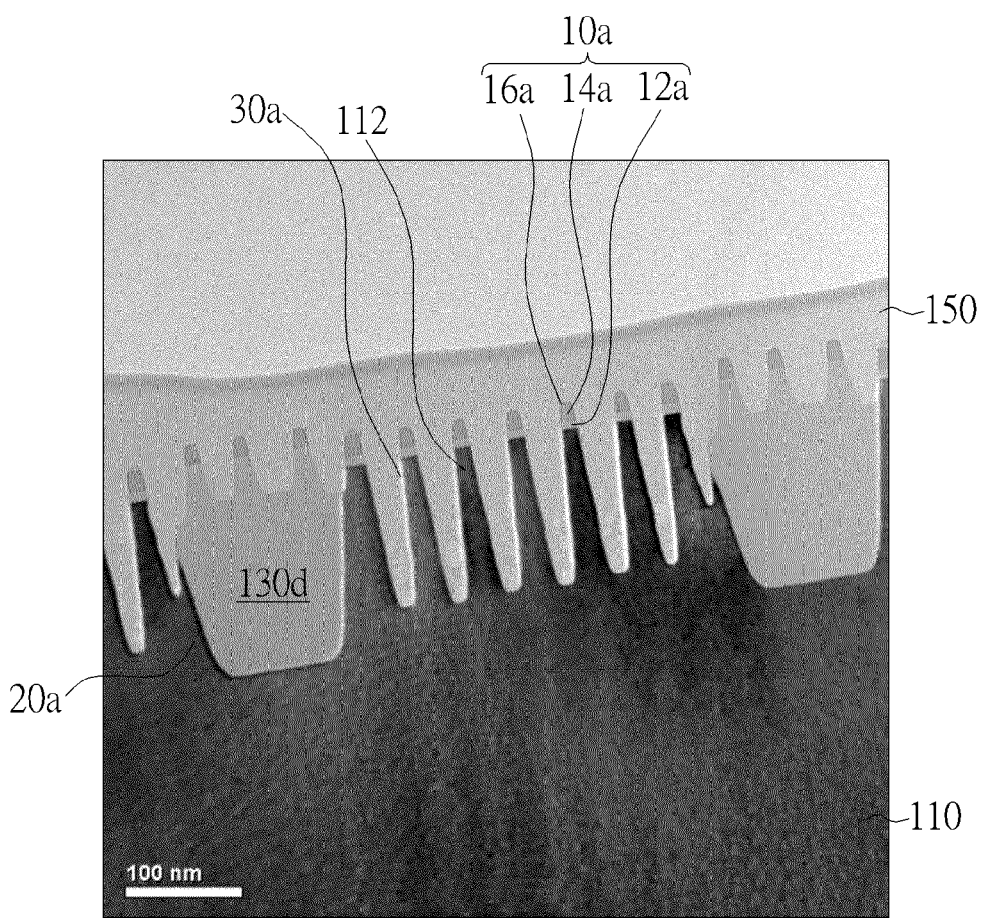
FIG. 18 schematically depicts a cross-sectional view under a transmission electron microscopy (TEM) according to an embodiment of the present invention.

As shown in FIG. 11, a second liner 30a may optionally and entirely cover the first isolation structure 130d, the first liner 20a, the fin structures 112 and the hard masks 10a. Then, a second isolation material 150 fills between each of the fin structures 112, meaning the second isolation material 150 filling the second trenches R2. In this embodiment, the second isolation material 150 fills up the second trenches R2 as well as covering the hard masks 10a and the first isolation structure 130d. In this embodiment, the process fills the second isolation material 150 without removing the first isolation structure 130d. Since a maximum depth d3 of the third trenches R3 of the first isolation structure 130d is less than the depths d2 of the second trenches R2, the maximum depth d3 of an interface S3 of the first isolation structure 130d and the second isolation material 150 (or the second liner 30) is less than the depths d2 of the second trenches R2. Besides, the interface S3 is a non-smooth surface due to the first isolation structure 130d having three third trenches R3. Under a practical circumstance, as shown in FIG. 18, which schematically depicts a cross-sectional view under a transmission electron microscopy (TEM) according to an embodiment of the present invention, corresponding components have common symbols.

Figure 15:
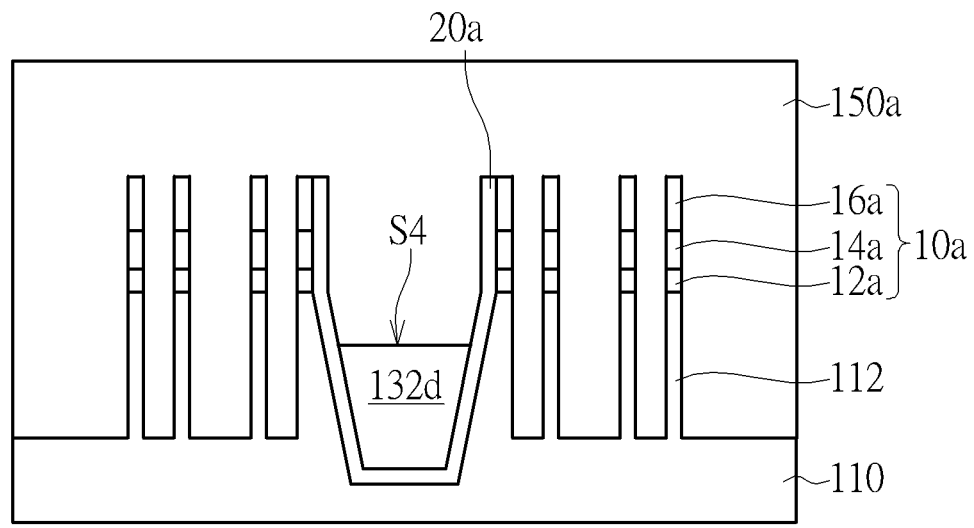
FIG. 15 schematically depicts a cross-sectional view of a semiconductor process according to another embodiment of the present invention.
Figure 16:
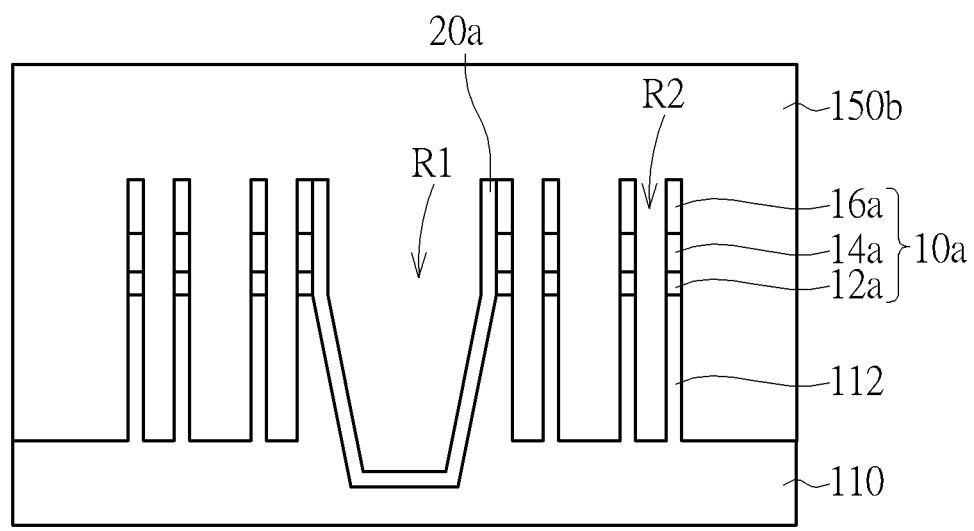
FIG. 16 schematically depicts a cross-sectional view of a semiconductor process according to still another embodiment of the present invention.

In another embodiment, a part of the first isolation structure 130d may be removed with a bottom part 132d of the first isolation structure 130d being reserved, and then a second isolation material 150a fills on the bottom part 132d and between the fin structures 112, as shown in FIG. 15. In this way, an interface S4 of the bottom part 130e and the second isolation material 150a can be adjusted to a desired surface such as a planar surface. In still another embodiment, the first isolation structure 130d may be removed completely and then a second isolation material 150b fills into the first trench R1 and between the fin structures 112, as shown in FIG. 16.

Figure 12:
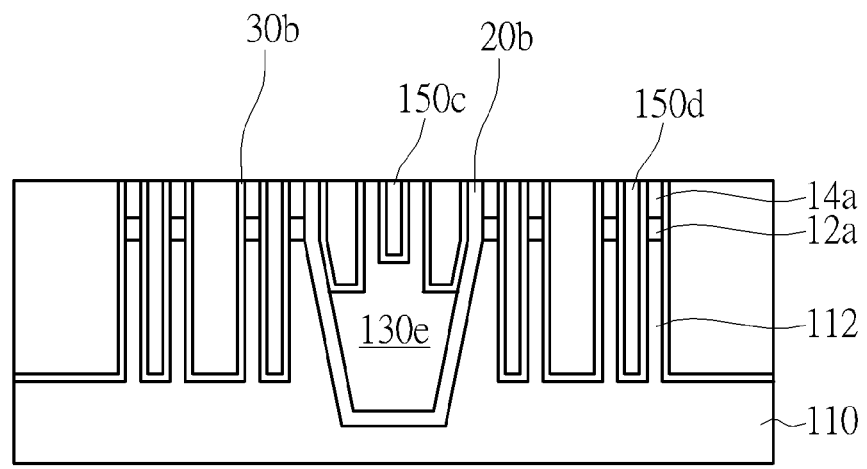

After blanketly covering the second isolation material 150 of FIG. 11, a part of the second isolation material 150 and the oxide layer 16a may be removed until the pad nitride layer 14a is exposed, thereby a second isolation material 150d being formed between the fin structures 112 and a second isolation structure 150c being formed, as shown in FIG. 12. Due to the second isolation material 150d and the second isolation structure 150c both being formed by the second isolation material 150, the second isolation material 150d and the second isolation structure 150c have common materials. In this embodiment, layers such as a part of the second isolation material 150, the first isolation structure 130d, the first liner 20a, the second liner 30a and the entire oxide layer 16a above the pad nitride layer 14a are removed completely by processes such as a planarization process until the pad nitride layer 14a is exposed, thereby a first isolation structure 130e, a first liner 20b and a second liner 30b being formed at the same time, wherein the second isolation structure 150c is located on the first isolation structure 130e, the second liner 30b is located between the second isolation structure 150c and the first isolation structure 130e, and a part of the first liner 20b contacts a part of the second liner 30b, but it is not limited thereto. In another embodiment, the part of these layers such as the second isolation material 150b and the oxide layer 16a may be removed by many processing steps.

Figure 13:
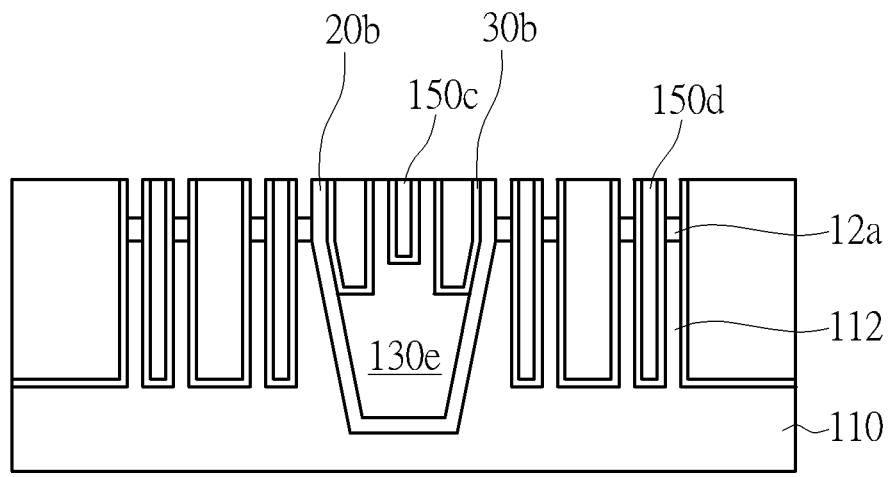

Thereafter, only the pad nitride layer 14a may be removed until the pad oxide layer 12a is exposed, as shown in FIG. 13. Therefore, a part of the second isolation material 150d between the fin structures 112 protrudes from the pad oxide layer 12a. In this embodiment, a selective etching process may be performed to remove the pad nitride layer 14a completely. This means the pad nitride layer 14a may be removed completely without etching other layers such as the pad oxide layer 12a, the second isolation structure 150c and the second isolation material 150d etc. by an etching process having etching selectivity to the pad nitride layer 14a and the other layers, but it is not limited thereto.

Figure 14:
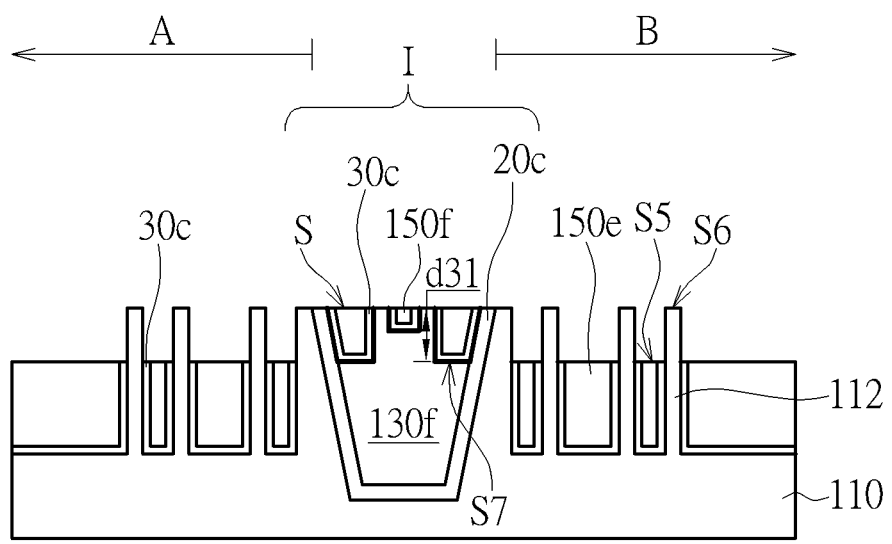

Then, a part of the second isolation material 150d and the second liner 30b, and the entire pad oxide layer 12a may be removed, as shown in FIG. 14. Therefore, a second liner 30c and a second isolation material 150e having a top surface S5 lower than top surfaces S6 of the fin structures 112 are formed between the fin structures 112, enabling gates being disposed across the fin structures 112 in later processes. In this embodiment, a part of the second isolation structure 150c, the first liner 20b and the first isolation structure 130e may be removed while the part of the second isolation material 150d is removed, thereby a second isolation structure 150f, a first isolation structure 130f and a first liner 20c being formed. Thereafter, later processes such as gate forming processes may be performed.

In addition, after the planarization process of FIG. 12 is performed, an etching back process similar to FIG. 14 may be performed to remove a part of the second isolation material 150d and the second liner 30b between the fin structures 112 to a predetermined depth, an then the pad nitride layer 14a and the pad oxide layer 12a being removed completely.

Above all, the fin structures 112 can be formed in the substrate 110 in the present invention, the second isolation material 150e can be formed between each of the fin structures 112, and the first isolation structure 130f and the second isolation structure 150f constituting an isolation structure I, wherein an interface S7 having a depth d31 is between the first isolation structure 130f and the second isolation structure 150f (or the second liner 30c). Furthermore, the first isolation structure 130f and the second isolation structure 150f may have common materials, therefore a part of the first isolation structure 130d/130e can be removed while a part of the second isolation material 150/150d is removed to form the isolation structure I having a flat top surface S. The isolation structure I may be located between a first area A and a second area B, and the top surfaces S5 of the second isolation material 150e between each of the fin structures 112 in the first area A and the second area B are all lower than the top surface S of the isolation structure I used for isolating different areas.

To summarize, the present invention provides a semiconductor structure and process thereof, which forms a sacrificial layer on a substrate; forms a first trench in the sacrificial layer and substrate; fills a first isolation material in the first trench, thereby a first isolation structure being formed; patterns the sacrificial layer to form a plurality of sacrificial patterns; forms a plurality of spacers beside the sacrificial patterns respectively; removes the sacrificial patterns; transfers layouts of the spacers into the substrate to form a plurality of fin structures in the substrate; and then, removes the spacers. Therefore, the isolation structure and the fin structures can be integrated.

Moreover, a part of the first isolation structure or the whole first isolation structure may be optionally removed, and then the second isolation material may cover the first isolation structure and between the fin structures. Therefore, an interface is inherently formed between the first isolation structure and the second isolation structure. The interface may be a non-smooth surface, or a planar surface formed by removing a part of the first isolation structure.

Furthermore, a first liner may be optionally formed before the first isolation material fills the first trench. A second liner may be optionally formed before the second isolation material is formed. Hence, an isolation structure constituted by the first isolation structure and the second isolation structure of the present invention may have both the first liner and the second liner, and the first liner may partially contact the second liner.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate having a plurality of fin structures;
   an isolation structure disposed in the substrate between the fin structures,
   wherein the isolation structure comprises a first isolation structure and a second isolation structure stacked from bottom to top, an interface is between the first isolation structure and the second isolation structure, and the second isolation structure is disposed in three sub recesses of the first isolation structure, wherein the sub recesses do not penetrate through the first isolation structure and do not expose the substrate; and wherein the second isolation structure includes three isolation parts separated from each other and arranged side by side, wherein one of the three isolation parts and the other isolation parts are of different heights and a second isolation material disposed between the fin structures, wherein top surfaces of the second isolation material is lower than a top surface of the isolation structure.

2. The semiconductor structure according to claim 1, wherein a depth of the isolation structure is larger than bottom surfaces of the fin structures.

3. The semiconductor structure according to claim 1, wherein a depth of the interface is less than bottom surfaces of the fin structures.

4. The semiconductor structure according to claim 1, wherein the material of the second isolation material is common to a material of the second isolation structure.

5. The semiconductor structure according to claim 1, wherein the interface comprises a non-smooth surface.

6. The semiconductor structure according to claim 1, wherein the first isolation structure and the second isolation structure both have oblique sidewalls, and the oblique sidewall of the first isolation structure and the oblique sidewall of the second isolation structure are stacked and widen from bottom to top.

* * * * *